United States Patent
Abdo (10) Patent No.: US 11,367,012 B2
(45) Date of Patent: *Jun. 21, 2022

(54) CAPACITIVELY-SHUNTED ASYMMETRIC DC-SQUID FOR QUBIT READOUT AND RESET

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/128,984

(22) Filed: Dec. 21, 2020

(65) Prior Publication Data

US 2021/0110291 A1  Apr. 15, 2021

Related U.S. Application Data

(63) Continuation of application No. 16/660,054, filed on Oct. 22, 2019, now Pat. No. 10,943,180, and a (Continued)

(51) Int. Cl.
*G06N 10/00* (2022.01)
*H01L 39/24* (2006.01)
(Continued)

(52) U.S. Cl.
CPC ........... *G06N 10/00* (2019.01); *H01L 39/223* (2013.01); *H01L 39/2493* (2013.01); *H03K 19/195* (2013.01)

(58) Field of Classification Search
CPC . G06N 99/002; H01L 39/223; H01L 39/2493; H03K 19/195
See application file for complete search history.

(56) References Cited

U.S. PATENT DOCUMENTS 4,509,018 A  *  4/1985  Gershenson ............ H03F 19/00
327/528
9,425,804 B2  8/2016  McDermott, III et al.
(Continued)

FOREIGN PATENT DOCUMENTS

DE        10312172 A1    9/2004
JP        2005527902 A   9/2005
JP        2008527684 A   7/2008

OTHER PUBLICATIONS

Receive Notice of Allowance, Application No. 2020-519668, dated Aug. 26, 2021.
(Continued)

*Primary Examiner* — Seokjin Kim
(74) *Attorney, Agent, or Firm* — Garg Law Firm, PLLC; Rakesh Garg; Erik Johnson (57) ABSTRACT

A tunable resonator is formed by shunting a set of asymmetric DC-SQUIDs with a capacitive device. An asymmetric DC-SQUID includes a first Josephson junction and a second Josephson junction, where the critical currents of the first and second Josephson junctions are different. A coupling is formed between the tunable resonator and a qubit such that the capacitively-shunted asymmetric DC-SQUIDs can dispersively read a quantum state of the qubit. An external magnetic flux is set to a first value and applied to the tunable resonator. A first value of the external magnetic flux causes the tunable resonator to tune to a first frequency within a first frequency difference from a resonance frequency of the qubit, the tunable resonator tuning to the first frequency causes active reset of the qubit.

23 Claims, 6 Drawing Sheets

Related U.S. Application Data continuation of application No. 16/257,153, filed on Jan. 25, 2019, now Pat. No. 10,535,013, and a continuation of application No. 15/787,842, filed on Oct. 19, 2017, now Pat. No. 10,235,635.

(51) Int. Cl.
*H01L 39/22* (2006.01)
*H03K 19/195* (2006.01)

(56) References Cited

U.S. PATENT DOCUMENTS

| | | | |
|---|---|---|---|
| 9,509,274 B2* | 11/2016 | Naaman | H01P 1/18 |
| 10,235,635 B1* | 3/2019 | Abdo | G06N 10/00 |
| 2006/0225165 A1* | 10/2006 | Maassen van den Brink | G06F 15/76 |
| | | | 257/9 |
| 2009/0033369 A1 | 2/2009 | Baumgardner et al. | |
| 2015/0028970 A1* | 1/2015 | Chow | H01P 7/00 |
| | | | 333/205 |
| 2016/0079968 A1* | 3/2016 | Strand | H03K 3/012 |
| | | | 327/528 |
| 2018/0145631 A1* | 5/2018 | Berkley | H03B 15/003 |
| 2019/0156238 A1* | 5/2019 | Abdo | G06N 10/00 |
| 2020/0050961 A1* | 2/2020 | Abdo | H01L 39/2493 |

OTHER PUBLICATIONS

Receive Notice of Allowance Translation, Application No. 2020-519668, dated Aug. 26, 2021.
List of all IBM related dockets, 2020.

* cited by examiner

CAPACITIVELY-SHUNTED ASYMMETRIC DC-SQUID FOR QUBIT READOUT AND RESET

TECHNICAL FIELD

The present invention relates generally to a superconducting device, a fabrication method, and fabrication system for reading a superconducting qubit state and resetting the superconducting qubit to a ground state. More particularly, the present invention relates to a device, method, and system for a tunable asymmetric DC-SQUID for qubit readout and reset.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

A reset of a qubit is the process by which the qubit's energy state returns from an excited state to a ground state. A time constant ($T_1$) characterizes the exponential decay versus time of the excited energy state of the qubit to the ground state.

In general, a superconducting quantum interference device (SQUID) is used as a very sensitive magnetometer that can measure extremely low magnetic fields. SQUIDs are sensitive enough to measure fields as low as 5 atto Tesla ($5 \times 10^{-18}$ T). For comparison, a typical refrigerator magnet produces 0.01 tesla ($10^{-2}$ T).

There are two main types of SQUID: direct current (DC) SQUID and radio frequency (RF) SQUID.

A dc-SQUID is based on the DC Josephson effect and has two Josephson junctions in parallel in a superconducting loop. In the absence of any external magnetic field, the input current splits into the two branches—one to each Josephson junction in the loop—equally. If a small external magnetic field is applied to the superconducting loop, a screening current, begins circulating in the loop that generates a magnetic field canceling the applied external flux. The induced current is in the same direction as in one of the branches of the superconducting loop, and is opposite to in the other branch; the total current becomes in one branch and in the other branch. As soon as the current in either branch exceeds the critical current L of the Josephson junction in that branch, a voltage appears across that junction. If the external flux is further increased until it exceeds , half the magnetic flux quantum, because the flux enclosed by the superconducting loop must be an integer number of flux quanta, instead of screening the flux the SQUID now energetically prefers to increase it to towards a flux quantum. The screening current now flows in the opposite direction. Thus, the screening current changes direction every time the flux increases by half integer multiples of flux quantum. Thus, the critical current oscillates in the superconducting loop of the dc-SQUID as a function of the applied flux.

The illustrative embodiments recognize that presently, a significant amount of time is wasted in waiting for the qubit to reset. Generally, for long-lived qubits the decay of the excited state to the ground state is slow. Consequently, the reset operation that is based on waiting for the qubit to decay to the ground state is also slow. The longer the $T_1$ of the qubit the longer is the idle time.

The illustrative embodiments recognize that this wastage of time has a direct adverse effect on the speed of quantum computations that are possible using superconducting qubits. The illustrative embodiments further recognize that because the commonly used method for reset is passive, i.e., not performed using circuit other than the qubit itself, other quantum circuits, such as the readout circuit that is presently employed for reading qubits, play no role in resetting the qubit.

The illustrative embodiments recognize that an active method of resetting the qubit is therefore desirable. In the active method, a quantum circuit external to the qubit operates in a manner to force the qubit to the ground energy state, accelerates the decay of the qubit to the ground energy state, or some combination thereof. The illustrative embodiments further recognize that a quantum circuit that is capable of multiple operations, such as both readout and reset operations on a qubit, is also highly desirable.

SUMMARY

The illustrative embodiments provide a superconducting device, and a method and system of fabrication therefor. A superconducting device of an embodiment includes a capacitive device shunting a set of asymmetric DC-SQUIDs to form a tunable resonator, an asymmetric DC-SQUID in the set of asymmetric DC-SQUIDs comprising a first Josephson junction and a second Josephson junction, wherein a first critical current of the first Josephson junction is different from a second critical current of the second Josephson junction. The superconducting device includes a coupling between the tunable resonator and a qubit such that the capacitively-shunted asymmetric DC-SQUIDs can dispersively read a quantum state of the qubit. An external magnetic flux is set to a first value and applied to the tunable resonator, wherein a first value of the external magnetic flux causes the tunable resonator to tune to a first frequency, wherein the first frequency is within a first frequency difference from a resonance frequency of the qubit, and wherein the tunable resonator tuning to the first frequency causes active reset of the qubit. Thus, the embodiment provides a superconducting device that is capable of performing an active reset of a qubit.

In another embodiment, the external magnetic flux is changed to a second value, wherein the second value of the external magnetic flux causes the tunable SQUID to tune to a second frequency, wherein the second frequency is detuned from the resonance frequency of the qubit by at least a second frequency difference, and wherein the tunable resonator tuning to the second frequency enables dispersive readout operation of the quantum state of the qubit to be performed by sending a microwave signal to the qubit-resonator system at the resonance frequency of the resonator and measuring the amplitude and/or the phase of the output signal. Thus, the embodiment provides a superconducting device that is capable of performing a readout as well as an active reset of a qubit.

In another embodiment, the second frequency is a maximum frequency in a frequency resonance range of the tunable resonator. Thus, the embodiment provides a particular manner of operating the superconducting device for performing the readout.

In another embodiment, the second frequency difference is a function of a degree of asymmetry between the first Josephson junction and the second Josephson junction. Thus, the embodiment provides a particular manner of configuring the superconducting device for performing the readout.

In another embodiment, the first frequency distance is zero and the first frequency is the resonance frequency of the qubit. Thus, the embodiment provides a particular manner of operating the superconducting device for performing the active reset.

In another embodiment, the first frequency being within the first frequency difference from the resonance frequency of the qubit causes the qubit to release a photon, the releasing causing the qubit to relax to a ground energy state. Thus, the embodiment provides a particular mechanism by which the superconducting device performs the reset.

In another embodiment, forcing the qubit to the ground energy state is faster than an energy decay time constant of the qubit. Thus, the embodiment provides a particular mechanism by which the reset performed by the superconducting device is an active reset.

In another embodiment, the set of asymmetric DC-SQUIDs includes only the asymmetric DC-SQUID. Thus, the embodiment provides a superconducting device in one alternative configuration.

Another embodiment further includes a series connection connecting a plurality of asymmetric DC-SQUIDs from the set of asymmetric DC-SQUIDs. Thus, the embodiment provides a superconducting device in another alternative configuration.

In another embodiment, the series connection comprises a superconducting wire. Thus, the embodiment provides a particular configuration in one alternative configuration of the superconducting device.

Another embodiment further includes a first pad formed on a first side of the set of asymmetric DC-SQUIDs. The embodiment includes a second pad forming on a second side of the set of asymmetric DC-SQUIDs, wherein the first pad and the second pad are separated by a distance, and wherein the first pad and the second pad together form the capacitive device. Thus, the embodiment provides another particular configuration in one alternative configuration of the superconducting device.

An embodiment includes a fabrication method for fabricating the superconducting device.

An embodiment includes a fabrication system for fabricating the superconducting device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the above-described needs for a tunable superconducting resonator for qubit readout and reset. The tunable resonator can be realized as a capacitively-shunted asymmetric DC-SQUID array.

An embodiment can be implemented as a capacitively-shunted asymmetric DC-SQUID. A design and fabrication method for the capacitively-shunted asymmetric SQUID can be implemented as a software application. The application implementing an embodiment can be configured to operate in conjunction with an existing superconductor fabrication system—such as a lithography system.

For the clarity of the description, and without implying any limitation thereto, the illustrative embodiments are described using some example numbers of SQUIDs. An embodiment can be implemented with a different number of SQUIDs within the scope of the illustrative embodiments.

Furthermore, simplified diagrams of the example SQUIDs, qubits, and other circuit components are used in the figures and the illustrative embodiments. In an actual fabrication or circuit, additional structures or component that are not shown or described herein, or structures or components different from those shown and described herein, may be present without departing the scope of the illustrative embodiments. Similarly, within the scope of the illustrative embodiments, a shown or described component in the example capacitively-shunted asymmetric DC-SQUID may be fabricated or coupled differently to yield a similar operation or result as described herein.

A specific value, location, position, or dimension of a component of capacitively-shunted asymmetric DC-SQUID described herein is not intended to be limiting on the illustrative embodiments unless such a characteristic is expressly described as a feature of an embodiment. The value, location, position, dimension, or some combination thereof, are chosen only for the clarity of the drawings and the description and may have been exaggerated, minimized, or otherwise changed from actual value, location, position, or dimension that might be used in actual fabrication or circuit to achieve an objective according to the illustrative embodiments.

Furthermore, the illustrative embodiments are described with respect to specific actual or hypothetical components only as examples. The steps described by the various illustrative embodiments can be adapted for fabricating a circuit using a variety of similarly purposed components in a similar manner, and such adaptations are contemplated within the scope of the illustrative embodiments.

The illustrative embodiments are described with respect to certain types of materials, electrical properties, structures, formations, steps, operations, dimensions, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 1:
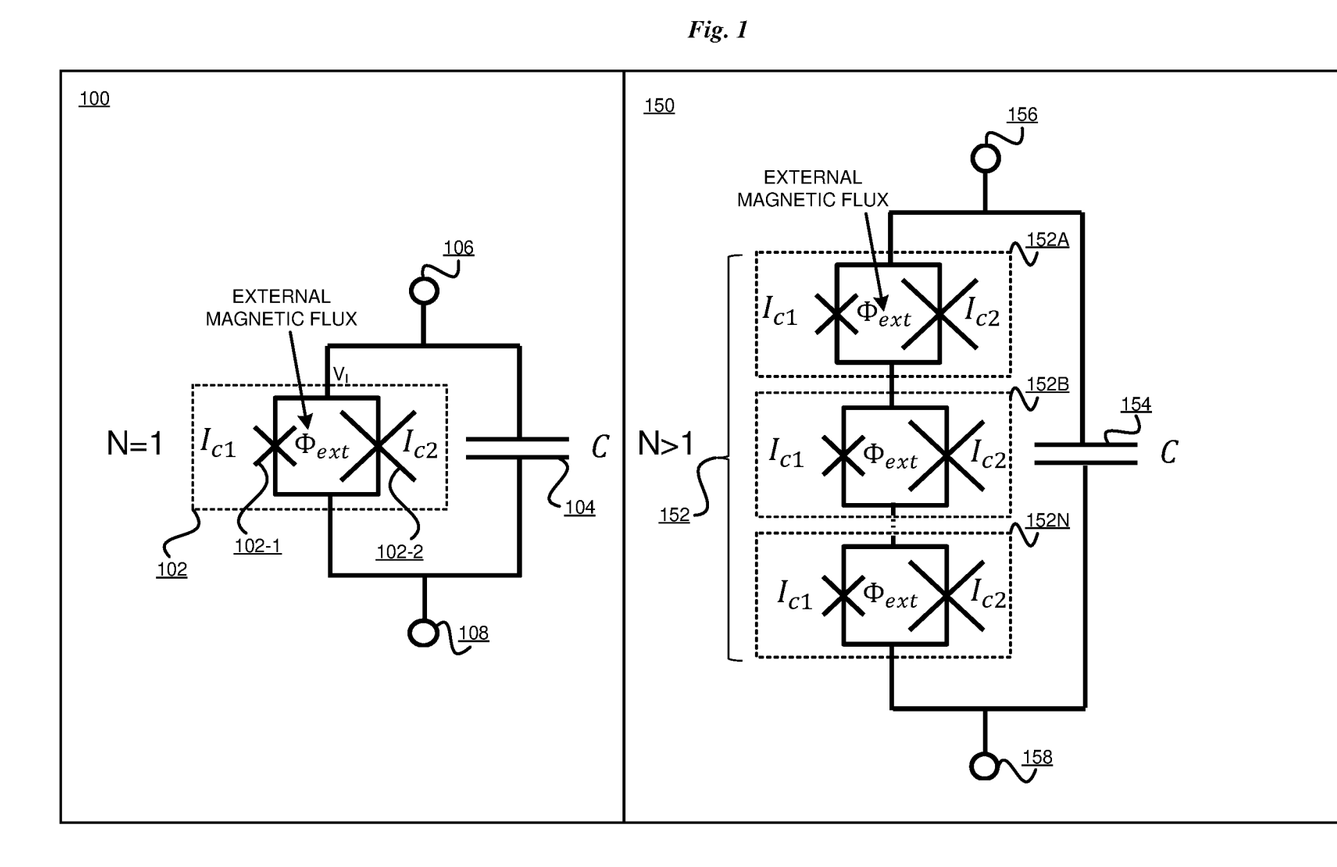
FIG. 1 depicts some example configurations of a capacitively-shunted asymmetric DC-SQUID in accordance with an illustrative embodiment.

With reference to FIG. 1, this figure depicts some example configurations of a capacitively-shunted asymmetric DC-SQUID in accordance with an illustrative embodiment. Configuration 100 forms one example configuration of a capacitively-shunted asymmetric DC-SQUID in which a single (N=1) asymmetric dc-SQUID 102 is used.

Josephson junction 102-1 and Josephson junction 102-2 are shown in their respective positions only as non-limiting examples. The positions of the Josephson junctions can be interchanged with one another in the superconducting loop of SQUID 102 assuming that input current I is delivered via a wire that is centered between Josephson junctions 102-1 and 102-2.

Asymmetric dc-SQUID 102 is a modification of a symmetric dc-SQUID in that the two Josephson junctions 102-1 and 102-2 in SQUID 102 have different critical currents (generally have different areas), as represented by the different sizes (not to scale) of the symbols (cross) representing the Josephson junctions in SQUID 102. Josephson junction 102-1 has critical current $I_{c1}$. Josephson junction 102-2 has critical current $I_{c2}$. According to the illustrative embodiments, Josephson junctions 102-1 and 102-2 are desirably of different sizes so as to allow when shunted by a capacitance for a limited band of tunable frequencies (frequency resonance range) of the device 100 or 150. For example, if the frequency of the qubit (not shown) that is to be read or reset is in the neighborhood of 4.7 Gigahertz (GHz), a desirable limited band of tunable frequency might range from 4.5 GHz to 8.5 GHz. If the sizes of the two Josephson junctions in SQUID 102 were identical, or near-identical, the bottom of the frequency range of the capacitively-shunted SQUID would approach vanishing frequencies, assuming the high limit of the range remained unchanged. As one of ordinary skill in the art would appreciate, a larger frequency band leads to steeper slopes between the peaks and troughs of the frequency tunability graph. The significance of ending the frequency range just below the frequency of the qubit, and the resulting smaller slopes in the frequency tunability curve of the capacitively-shunted SQUID, will become clearer from FIGS. 4-6 described herein. Asymmetric Josephson junctions 102-1 and 102-2, when selected suitably, allow a stable frequency minimum of the frequency range of the capacitively-shunted asymmetric DC-SQUID 102.

Asymmetric DC-SQUID 102 is shunted (electrically coupled in parallel) with capacitive device 104. Capacitor 104 in parallel with the inductance of asymmetric DC-SQUID 102 forms capacitively-shunted asymmetric DC-SQUID 100 which functions as a tunable resonator. Tunable resonator 100 operates as a resonator whose frequency is tunable or changeable by tuning or adjusting an external magnetic flux ($\Phi_{ext}$) applied to tunable SQUID 100. It is assumed that the inductance of the superconducting loops of the SQUIDs 102 is small and satisfies the inequality $L(I_{c1}+I_{c2})<<\Phi_{ext}$. This assumption mainly simplifies the analysis and the calculation of the device response, because it implies that the total flux threading the dc-SQUID loop is equal or almost equal to the applied external flux $\Phi_{ext}$.

Tunable resonator 100 can be coupled with a qubit (not shown) and/or an input/output transmission line (not shown) of a circuit (not shown) using nodes 106 and 108. By adjusting the external flux, tunable resonator 100 exhibits a resonance frequency response which lies within the frequency range, which is set at least in part by the chosen asymmetrical critical currents (sizes) of Josephson junctions 102-1 and 102-2, and the size of capacitor 104. This tunable frequency of the tunable resonator 100 can be tuned to be the same as or close to the transition frequency of the qubit (qubit resonance frequency), or can be tuned to be at the far end of the frequency range from the frequency of the qubit. When the frequency of tunable resonator 100 is tuned to be the same as or close to the frequency of the qubit, tunable resonator 100—which in principle is a resonator—is said to be in resonance with the qubit. When the frequency of tunable resonator 100 is tuned to be significantly different from the frequency of the qubit, tunable resonator 100 is said to be out of resonance with the qubit.

Tunable SQUID-based resonator 100 can thus be tuned to actively reset or read the qubit by simply tuning the inductance of SQUID 102, this in turn tunes the resonator in or out of resonance with the qubit. When the qubit state is to be reset/initialized into the ground state, the frequency of tunable resonator 100 is tuned into resonance with the qubit resonance frequency. This in-resonance tuning of tunable resonator 100 stimulates emission of a photon from the qubit into the readout resonator (tunable resonator 100) through the Purcell effect and consequently leaves the qubit in the ground state.

When the qubit state is to be read out or otherwise manipulated, the frequency of the readout resonator (tunable resonator 100) is tuned out of resonance with the qubit resonance frequency. In this mode of operation, the qubit state is read using the dispersive readout technique. In this case, the tunable resonator frequency is parked at a sweet spot corresponding to the maximum resonance frequency of the readout resonator versus flux. The sweet spot has a zero slope (or near zero slope) region of the frequency tunability curve of tunable resonator 100 versus flux. The zero-slope point or the near-zero slope region minimizes the susceptibility of the readout resonator frequency to flux noise.

Configuration 150 forms another example configuration of a tunable resonator in which a plurality (N>1) of asymmetric dc-SQUIDs 152A, 152B . . . 152N are used. Each of asymmetric DC-SQUIDs 152A-N is configured and operates in the manner of asymmetric DC-SQUID 102 in tunable resonator 100.

Asymmetric DC-SQUIDs 152A-N are linked in series as shown. The series of asymmetric DC-SQUIDs 152A-N is shunted with capacitor 154. Capacitor 154 is similar in function to capacitor 104 in tunable resonator 100, but may be different in size according to the inductance of asymmetric DC-SQUID series 152 and the frequency resonance range desired from tunable SQUID 152. Nodes 156 and 158 correspond to nodes 106 and 108, respectively, in tunable resonator 100.

In one embodiment, each asymmetric DC-SQUID 152A, 152B, 152N is substantially identical to one another. In another embodiment, series 152 can include an asymmetric DC-SQUID that has the same or different sizes of one or both Josephson junctions as compared to another asymmetric DC-SQUID in the series.

Figure 2:
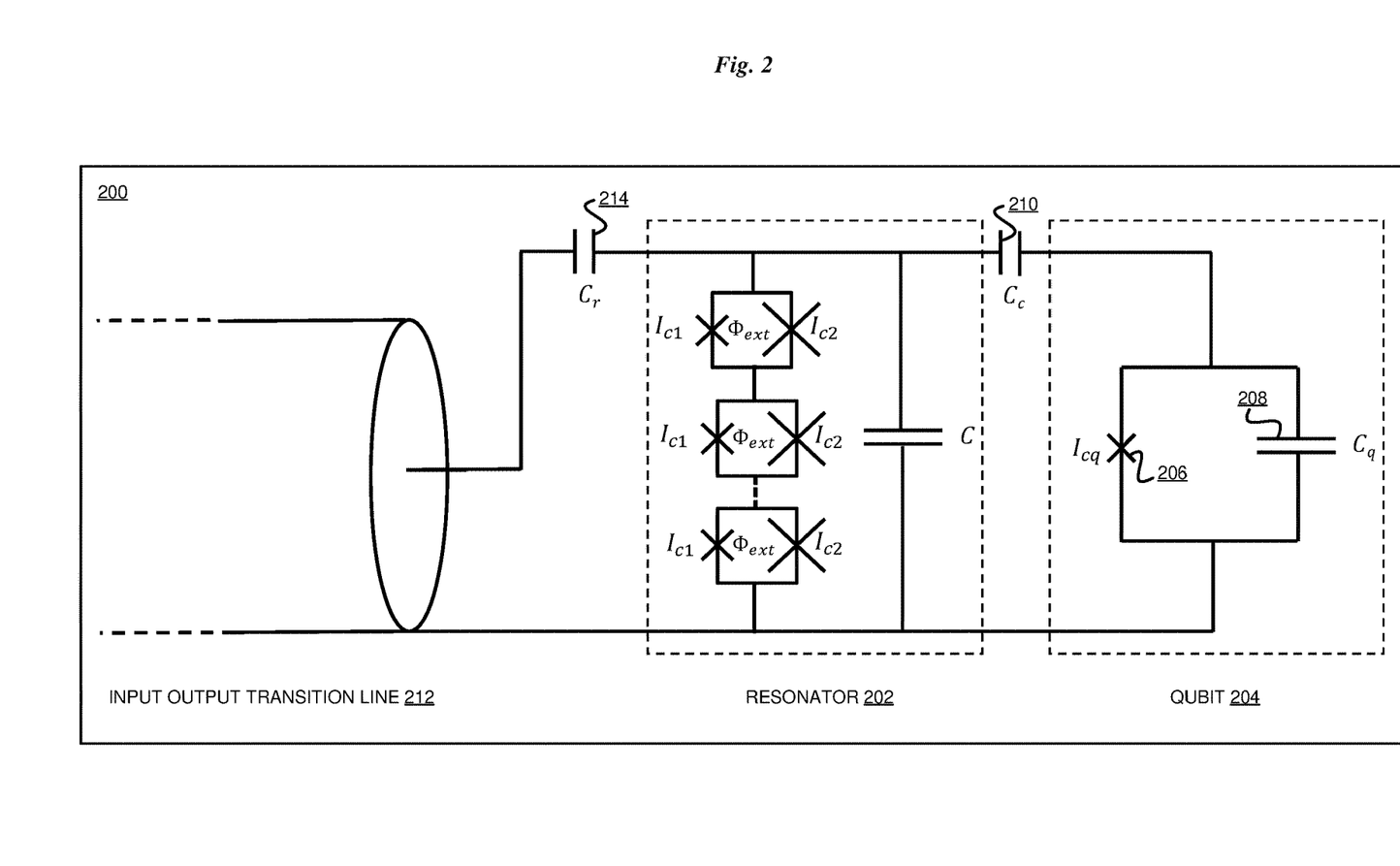
FIG. 2 depicts a circuit schematic of a tunable asymmetric DC-SQUID for qubit readout and reset used in accordance with an illustrative embodiment.

With reference to FIG. 2, this figure depicts a circuit schematic of a tunable asymmetric DC-SQUID for qubit readout and reset used in accordance with an illustrative embodiment. Resonator 202 can be tunable SQUID 100 or tunable SQUID 150 from FIG. 1. In the depicted non-limiting example, resonator 202 is tunable SQUID 150.

Resonator 202 is configured to read and reset qubit 204. Qubit 204 is formed using Josephson junction 206 and capacitor 208. Josephson junction 206 has a critical current of $I_{cq}$ and capacitor 208 has a capacitance of $C_q$. Node 156 (or 106 as the case may be) couples with qubit 204 via coupling capacitor 210 of capacitance $C_c$. Node 156 (or 106 as the case may be) couples with input/output transmission line 212 via readout capacitor 214 of capacitance $C_r$. Node 158 (or 108 as the case may be) couples with qubit 204 as shown.

Figure 3:
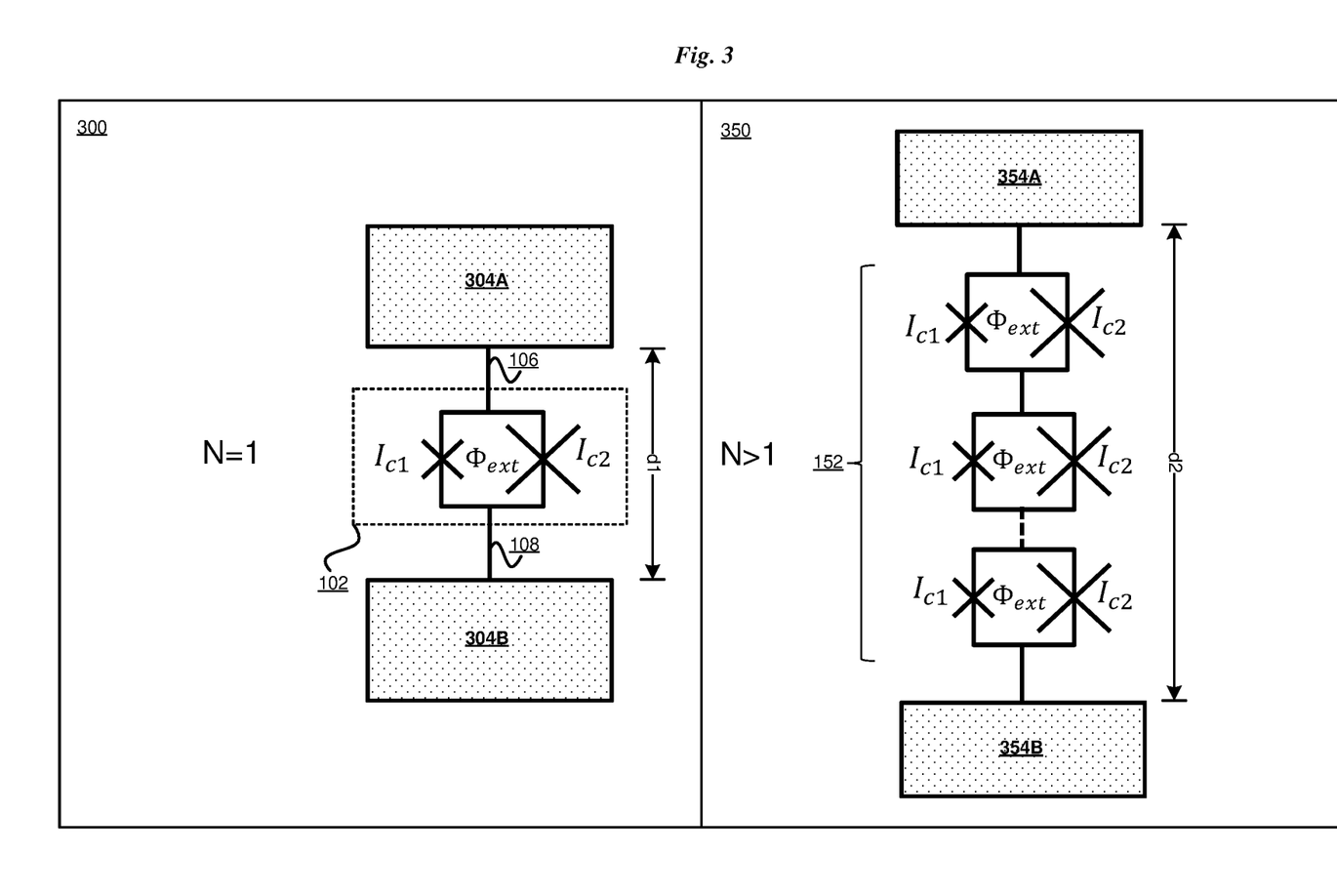
FIG. 3 depicts two example realizations of tunable resonators are depicted in accordance with an illustrative embodiment.

With reference to FIG. 3, two example realizations of tunable resonators are depicted in accordance with an illustrative embodiment. Tunable resonator 300 is substantially similar in functionality to tunable resonator 100 of FIG. 1. Tunable resonator 350 is substantially similar in functionality to tunable resonator 150 of FIG. 1.

Capacitor 104 in tunable SQUID can be fabricated in a variety of implementation-specific ways, using a variety of lithography methods. In one such method, pads 304A and 304B are formed and coupled with tunable SQUID 102 via nodes 106 and 108 respectively, as shown. Pads 304A and 304B, fabricated of a superconducting material, are separated by a distance/gap d1, thereby forming a capacitor, i.e., capacitor 104 of tunable resonator 100. In one embodiment, pads 304A and 304B are co-planar, i.e., in the same plane of fabrication.

Capacitor 154 can be similarly fabricated for tunable SQUID 154. For example, pads 354A and 354B, fabricated of a superconducting material, are separated by a distance d2, thereby forming a capacitor, i.e., capacitor 154 of tunable SQUID 100. In one embodiment, pads 354A and 354B are co-planar.

Figure 4:
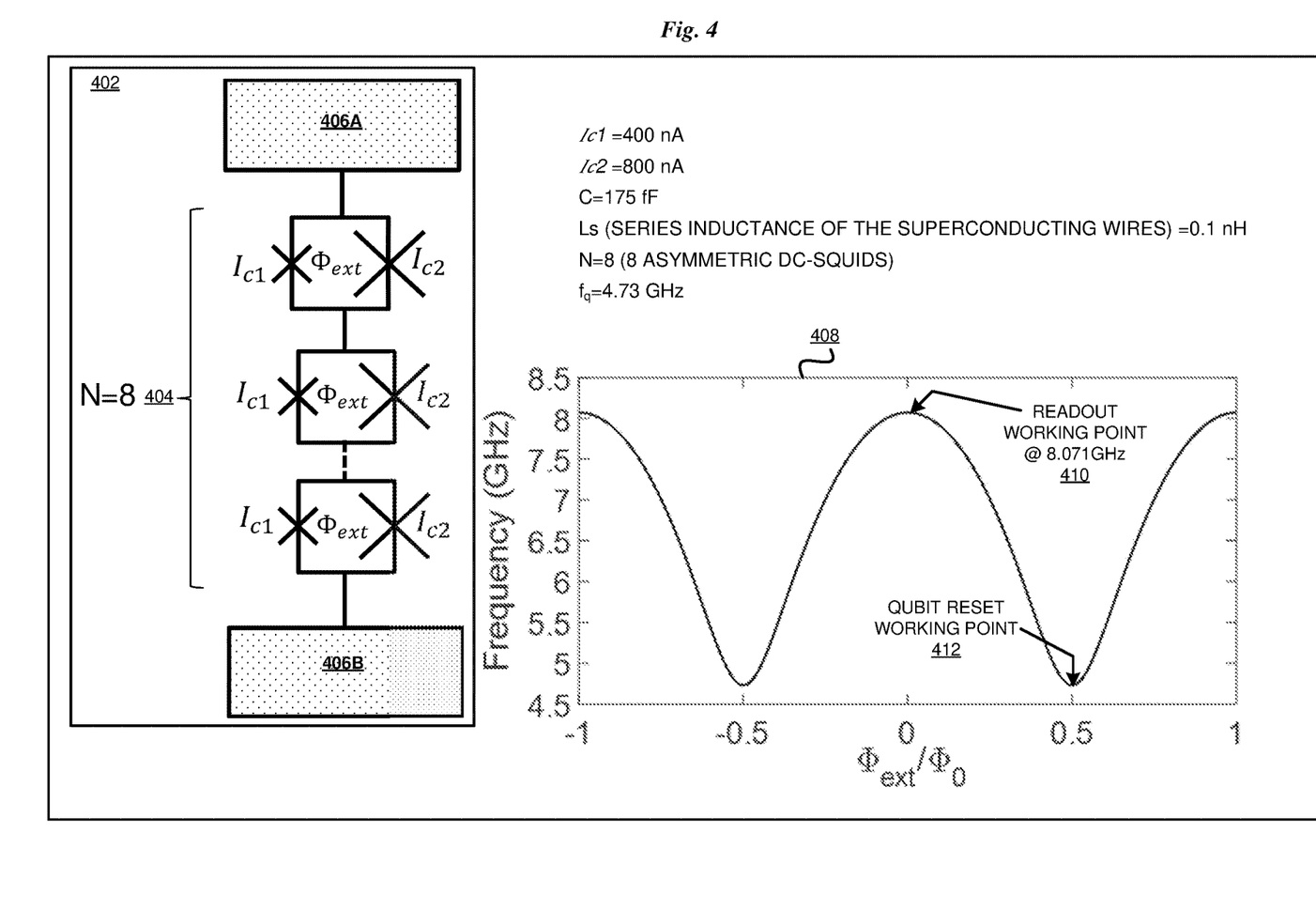
FIG. 4 depicts one example configuration of a tunable resonator for active reset and readout of a qubit in accordance with an illustrative embodiment.

With reference to FIG. 4, this figure depicts one example configuration of a tunable resonator for active reset and readout of a qubit in accordance with an illustrative embodiment. Only as a non-limiting example, in one configured experiment, tunable resonator 402 was configured in the manner of tunable resonator 350 of FIG. 3, with eight (N=8) similar asymmetric DC-SQUIDs in series 404. For each asymmetric DC-SQUID in series 404, $I_{c1}$ was 400 nanoamperes (nA) and $I_{c2}$ was 800 nA. Capacitance C between pads 306A and 306B—which operate as the shunt capacitor in tunable resonator 402—was 175 femto-Farad (fF). The series inductance of series 404 was 0.1 nanoHenry (nH). Tunable resonator 402 was configured to readout and reset a qubit (not shown) whose resonance frequency $f_q$ was 4.73 GHz.

Graph 408 plots the change in the resonance frequency of tunable resonator 402 when $\Phi_{ext}$ changes, where $\Phi_{ext}$ is the applied external flux threading the loop of each dc-SQUID. The X-axis of graph 408 represents the ratio $\Phi_{ext}/\Phi_0$, where $\Phi_0$ is flux quantum. The Y-axis of graph 408 plots the resonance frequency of the device as a function of the ratio $\Phi_{ext}/\Phi_0$.

As graph 408 shows, resonance frequency peaks with zero slopes occur when $\Phi_{ext}$ is an integer multiple of $\Phi_0$. Resonance frequency valleys with zero slopes occur when $\Phi_{ext}$ is a plus or minus odd-integer multiple of $\Phi_0/2$. Tunable resonator 402 is constructed with suitable asymmetric Josephson junctions and capacitance C such that the resonance frequency valley with zero slope points occur at or near $f_q$.

When tunable resonator 402 is tuned to a resonance frequency peak with zero slope (detuned far from qubit frequency), by varying $\Phi_{ext}$, e.g., point 410 or another zero-slope resonance frequency peak point (a maximum frequency), the qubit can be read out as described herein. In the calculation example, which uses the depicted configuration, a zero-slope resonance frequency peak was reached at 8.071 GHz.

When tunable resonator 402 is tuned to a resonance frequency valley with zero slope by varying $\Phi_{ext}$, e.g., point 412 or another zero-slope resonance frequency valley point (a minimum frequency), the qubit can be reset as described herein. In the calculation example, which uses the depicted configuration, a zero-slope resonance frequency valley was reached at 4.73 GHz.

Figure 5:
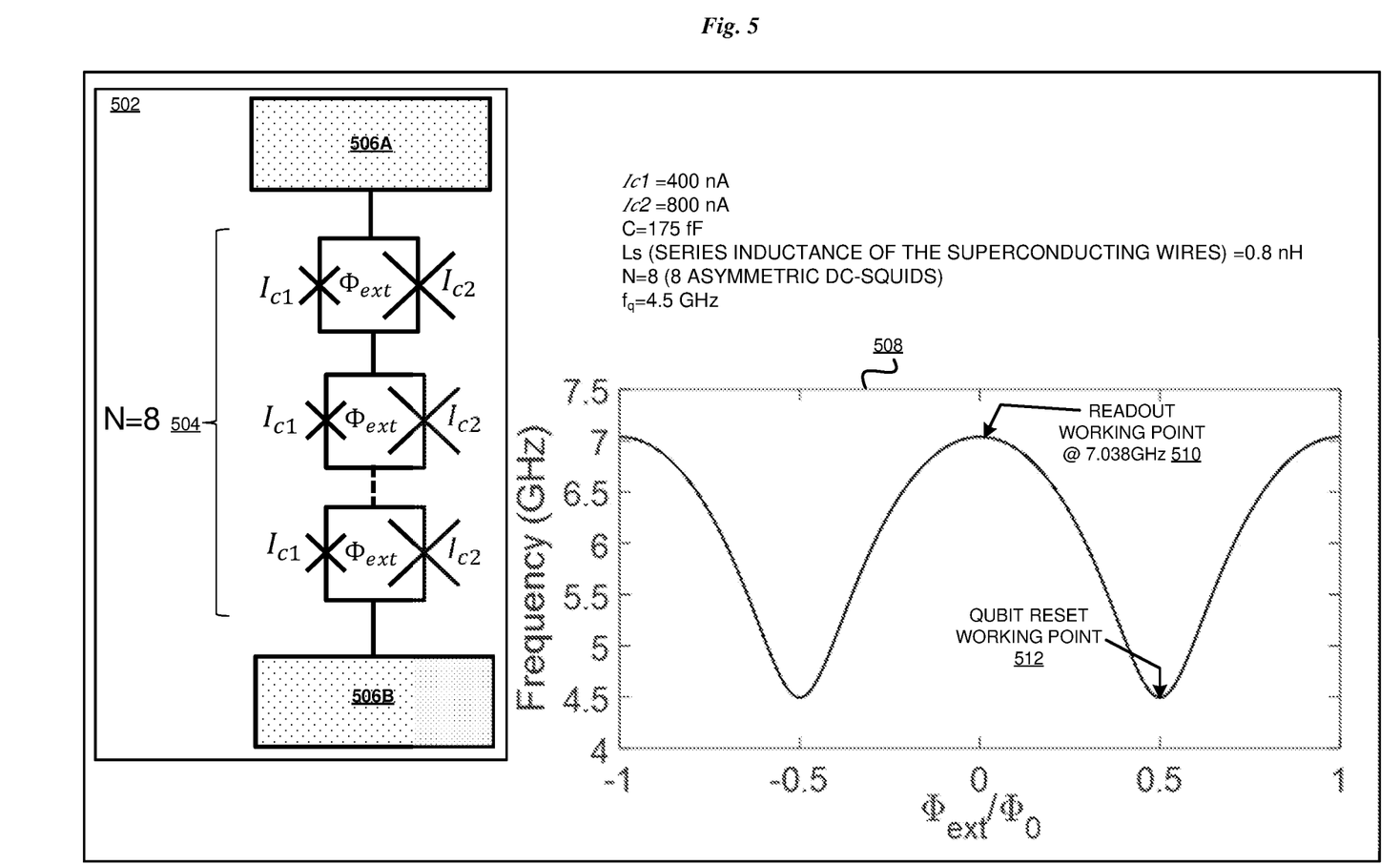
FIG. 5 depicts another example configuration of a tunable resonator for active reset and readout of a different qubit in accordance with an illustrative embodiment.

With reference to FIG. 5, this figure depicts another example configuration of a tunable resonator for active reset and readout of a different qubit in accordance with an illustrative embodiment. Tunable resonator 502 was configured substantially in the manner described with respect to FIG. 4, but with series inductance L=0.8 nH. Series 504 is configured substantially in the manner of series 404 but with the different series inductance, e.g., by changing the shape, size, or material of the superconducting wires. Pads 506A and 506B form the shunt capacitor substantially in the manner of pads 406A and 406B.

Tunable resonator 502 was configured to readout and reset a qubit (not shown) whose resonance frequency $f_q$ was 4.5 GHz. Graph 508 plots the change in the resonance frequency of tunable resonator 502 as a function of $\Phi_{ext}$, in the manner of graph 408.

When tunable SQUID 502 is tuned to a zero slope peak point (detuned far from qubit frequency), by varying $\Phi_{ext}$, e.g., point 510 or another zero slope peak point, the qubit can be readout as described herein. In the calculation example, which uses the depicted configuration, a zero-slope resonance frequency peak was reached at 7.038 GHz.

When tunable SQUID 502 is tuned to a zero-slope resonance frequency valley (minimum) by varying $\Phi_{ext}$, e.g., point 512 or another zero-slope resonance frequency valley point, the qubit can be reset as described herein. In the calculation example, which uses the depicted configuration, a zero-slope resonance frequency valley was reached at 4.5 GHz.

Figure 6:
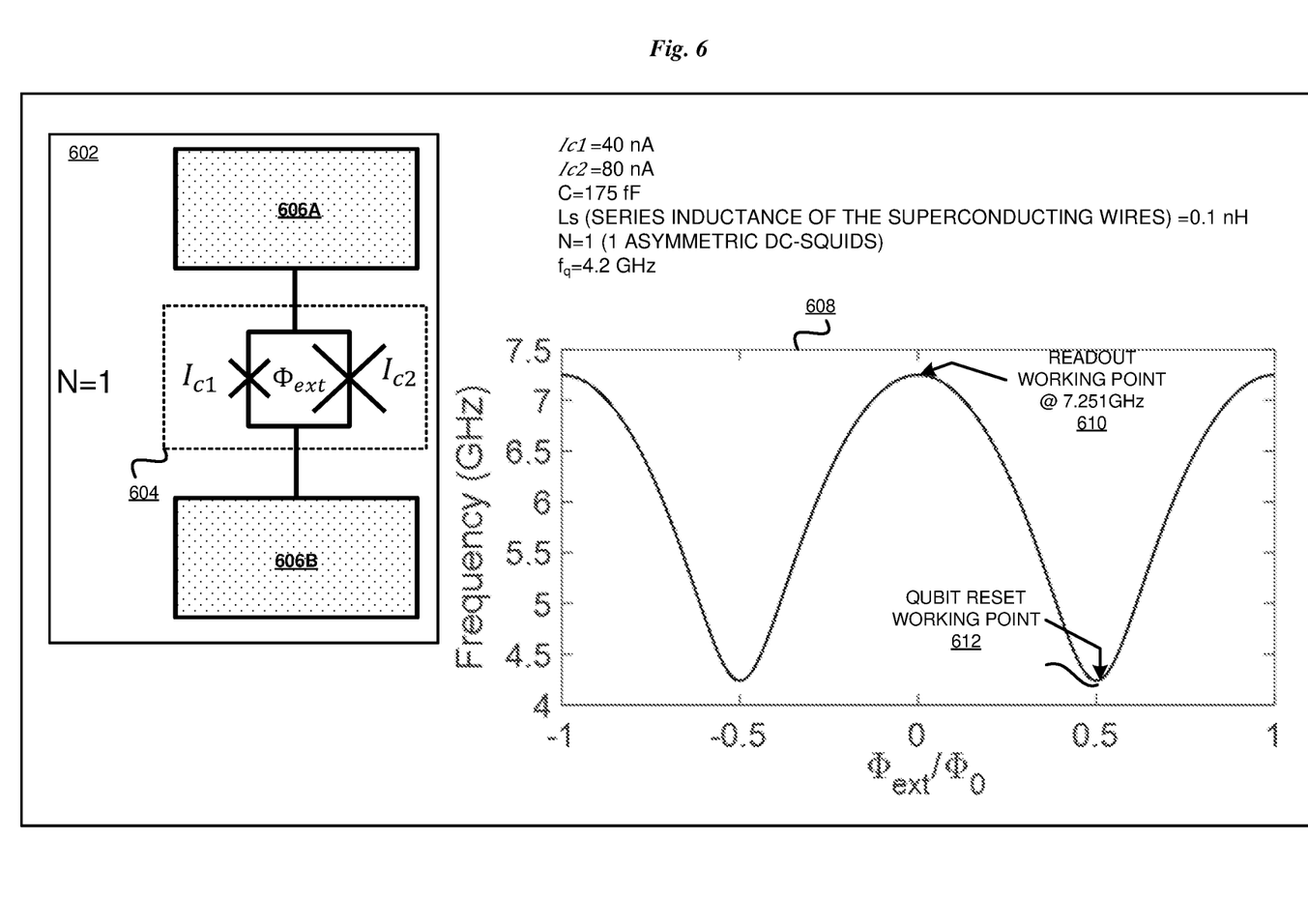
FIG. 6 depicts another example configuration of a tunable resonator for active reset and readout of a superconducting qubit in accordance with an illustrative embodiment.

With reference to FIG. 6, this figure depicts another example configuration of a tunable resonator for active reset and readout of a superconducting qubit in accordance with an illustrative embodiment. Only as a non-limiting example, in one configured experiment, tunable resonator 602 was configured in the manner of tunable resonator 300 of FIG. 3, with a single (N=1) asymmetric DC-SQUID 604. When constructing a tunable resonator with a single asymmetric DC-SQUID, as in this case, a risk of possible hybridization effects between the energy states of the qubit and the qubit-like resonator exists. Such a configuration should be theoretically analyzed in order to verify there is no undesired effects.

For asymmetric DC-SQUID 604, $I_{c1}$ was 40 nA and $I_{c2}$ was 80 nA. Capacitance C between pads 606A and 606B—which operate as the shunt capacitor in tunable resonator 300—was 175 fF. The series inductance asymmetric DC-SQUID 604 was 0.1 nH. Tunable resonator 602 was configured to readout and reset a qubit (not shown) whose resonance frequency $f_q$ was 4.2 GHz.

Graph 608 plots the change in the resonance frequency of tunable resonator 602 when $\Phi_{ext}$ is varied, in the manner of graph 408 or 508.

When tunable resonator 602 is tuned to a zero-slope resonance frequency peak (detuned far from qubit frequency), by varying $\Phi_{ext}$, e.g., point 610 or another zero-slope resonance frequency peak, the qubit can be readout as described herein. In the calculation example, which uses the depicted configuration, a zero-slope resonance frequency peak was reached at 7.251 GHz.

When tunable resonator 602 is tuned to a zero-slope resonance frequency valley point by varying $\Phi_{ext}$, e.g., point 612 or another zero-slope resonance frequency valley point, the qubit can be reset as described herein. In the calculation example, which uses the depicted configuration, a zero-slope resonance frequency valley was reached at 4.2 GHz.

A tunable resonator in the form of a capacitively shunted asymmetric DC-SQUID according to an embodiment described herein is compact in size and has a small footprint, can be fabricated using the same fabrication process as the qubits, provides a mechanism for fast qubit reset, has a high internal Q (>2 M), has a low participation ratio on surfaces, and has high Q Josephson junctions (higher Q than superconducting meander-line inductors). Furthermore, the capacitively shunted asymmetric DC-SQUID according to an embodiment eliminates the need for a fast readout resonator to reset qubits, as that apparatus is known to shorten the qubit lifetime $T_1$. Additionally, using a capacitively shunted asymmetric DC-SQUID according to an embodiment to perform reset (by tuning it in resonance with the qubit), there is no need for qubit measurement and feedback to reset the qubit state.

What is claimed is:

1. A superconducting device comprising:
   a capacitive device shunting at least one asymmetric direct current superconducting quantum interference device (DC-SQUID); and
   a tunable resonator formed by the at least one asymmetric DC-SQUID and the capacitive device, the tunable resonator being responsive to an external magnetic flux such that a first value of the external magnetic flux causes the tunable resonator to tune to a first frequency, and such that tuning to the first frequency causes active reset of a qubit coupled to the tunable resonator, and wherein the first frequency being within a first frequency difference from the resonance frequency of the qubit causes the qubit to release a photon, the releasing causing the qubit to relax to a ground energy state.

2. The superconducting device of claim 1, wherein the tunable resonator is further responsive to the external magnetic flux such that a second value of the external magnetic flux causes the tunable resonator to tune to a second frequency, wherein the first frequency is within a first frequency difference from a resonance frequency of the qubit, wherein the second frequency is detuned from the resonance frequency of the qubit by at least a second frequency difference, and wherein the tunable resonator tuning to the second frequency enables a dispersive readout operation of a quantum state of the qubit to be performed.

3. The superconducting device of claim 2, wherein the second frequency is a maximum frequency in a frequency resonance range of the tunable resonator.

4. The superconducting device of claim 2, wherein the second frequency difference is a function of a degree of asymmetry between a first Josephson junction and a second Josephson junction in the at least one asymmetric DC-SQUID.

5. The superconducting device of claim 1, wherein the first frequency difference is zero and the first frequency is the resonance frequency of the qubit.

6. The superconducting device of claim 1, wherein forcing the qubit to the ground energy state is faster than an energy decay time constant of the qubit.

7. The superconducting device of claim 1, wherein the at least one asymmetric DC-SQUID includes only one asymmetric DC-SQUID.

8. The superconducting device of claim 1, further comprising:
wherein the at least one asymmetric DC-SQUID includes a plurality of asymmetric DC-SQUIDs; and
wherein the superconducting device further comprises a series connection connecting the plurality of asymmetric DC-SQUIDs.

9. The superconducting device of claim 8, wherein the series connection comprises a superconducting wire.

10. The superconducting device of claim 1, further comprising:
a first pad formed on a first side of the at least one asymmetric DC-SQUID; and
a second pad formed on a second side of the at least one asymmetric DC-SQUID, wherein the first pad and the second pad are separated by a distance, and wherein the first pad and the second pad together form the capacitive device.

11. A method comprising:
forming a tunable resonator by shunting at least one asymmetric direct current superconducting quantum interference device (DC-SQUID) with a capacitive device; and
actively resetting a qubit by applying an external magnetic flux of a first value to the tunable resonator, wherein a first value of the external magnetic flux causes the tunable resonator to tune to a first frequency,
wherein the first frequency being within a first frequency difference from the resonance frequency of the qubit causes the qubit to release a photon, the releasing causing the qubit to relax to a ground energy state.

12. The method of claim 11, further comprising:
changing the external magnetic flux to a second value, wherein the second value of the external magnetic flux causes the tunable resonator to tune to a second frequency, wherein the first frequency is within a first frequency difference from a resonance frequency of the qubit, wherein the second frequency is detuned from the resonance frequency of the qubit by at least a second frequency difference; and
performing, using the tunable resonator tuned to the second frequency, a dispersive readout operation of a quantum state of the qubit.

13. The method of claim 12, wherein the second frequency is a maximum frequency in a frequency resonance range of the tunable resonator.

14. The method of claim 12, wherein the second frequency difference is a function of a degree of asymmetry between a first Josephson junction and a second Josephson junction in the at least one asymmetric DC-SQUID.

15. The method of claim 11, wherein the first frequency difference is zero and the first frequency is the resonance frequency of the qubit.

16. The method of claim 11, wherein forcing the qubit to the ground energy state is faster than an energy decay time constant $T_1$ of the qubit.

17. The method of claim 11, wherein the at least one asymmetric DC-SQUID includes only one asymmetric DC-SQUID.

18. The method of claim 11, further comprising:
wherein the at least one asymmetric DC-SQUID includes a plurality of asymmetric DC-SQUIDs; and
wherein the method further comprises connecting the plurality of asymmetric DC-SQUIDs in a series.

19. The method of claim 18, wherein the plurality of asymmetric DC-SQUIDs are connected in series using a superconductor.

20. The method of claim 11, further comprising:
forming a first pad on a first side of the at least one asymmetric DC-SQUID; and
forming a second pad on a second side of the at least one asymmetric DC-SQUID, wherein the first pad and the second pad are separated by a distance, and wherein the first pad and the second pad together form the capacitive device.

21. A superconducting fabrication system which when operated to fabricate a tunable resonator device performing operations comprising:
forming the tunable resonator by shunting at least one asymmetric direct current superconducting quantum interference device (DC-SQUID) with a capacitive device; and
actively resetting a qubit by applying an external magnetic flux of a first value to the tunable resonator, wherein a first value of the external magnetic flux causes the tunable resonator to tune to a first frequency,
wherein the first frequency being within a first frequency difference from the resonance frequency of the qubit causes the qubit to release a photon, the releasing causing the qubit to relax to a ground energy state.

22. The superconducting fabrication system of claim 21, wherein the tunable resonator is further responsive to the external magnetic flux such that a second value of the external magnetic flux causes the tunable resonator to tune to a second frequency,
wherein the first frequency is within a first frequency difference from a resonance frequency of the qubit,
wherein the second frequency is detuned from the resonance frequency of the qubit by at least a second frequency difference; and
wherein the tunable resonator tuning to the second frequency enables a dispersive readout operation of a quantum state of the qubit.

23. The superconducting fabrication system of claim 22, wherein the second frequency is a maximum frequency in a frequency resonance range of the tunable resonator.

* * * * *